US006727145B1

(12) United States Patent
Wen

(10) Patent No.: US 6,727,145 B1
(45) Date of Patent: Apr. 27, 2004

(54) METHOD FOR FABRICATING POST-PROCESS ONE-TIME PROGRAMMABLE READ ONLY MEMORY CELL

(75) Inventor: Wen Ying Wen, Hsinchu (TW)

(73) Assignee: Megawin Technology Co., Ltd., Hsinchu (TW)

( * ) Notice: Subject to any disclaimer, the term of this patent is extended or adjusted under 35 U.S.C. 154(b) by 0 days.

(21) Appl. No.: 10/327,972

(22) Filed: Dec. 26, 2002

(51) Int. Cl.⁷ .............................................. H01L 21/336
(52) U.S. Cl. ...................................... 438/257; 438/278
(58) Field of Search .............................. 438/257, 258, 438/262, 311, 316, 278

(56) References Cited

U.S. PATENT DOCUMENTS 5,532,181 A * 7/1996 Takebuchi et al. ........... 438/278
5,666,311 A * 9/1997 Mori ........................... 438/257
5,946,230 A * 8/1999 Shimizu et al. ........ 365/185.01
6,583,490 B2 * 6/2003 Hagiwara et al. ............ 257/530

* cited by examiner

*Primary Examiner*—David Nhu
(74) *Attorney, Agent, or Firm*—Rosenberg, Klein & Lee

(57) ABSTRACT

The present invention generally relates to a method for fabricating a post-process one-time programmable (OTP) read only memory cell (ROM cell). The OTP ROM cell has two oxide layers positioned on a semiconductor substrate and a plurality of semiconductor-implanted regions are implanted in the semiconductor substrate. Oxide layers are respectively to those semiconductor-implanted regions of the semiconductor substrate and having a window-type isolating channel region for each. Finally, a polysilicon layer is positioned on the thicker oxide layer as a gate electrode region of the OTP ROM cell. Hence, the polysilicon layer can be applied a voltage to penetrate the thinker oxide layer of the window-type isolating channel region to form a P-N junction between the semiconductor-implanted regions and the polysilicon layer and then the ROM cell is programmed.

6 Claims, 4 Drawing Sheets

METHOD FOR FABRICATING POST-PROCESS ONE-TIME PROGRAMMABLE READ ONLY MEMORY CELL

BACKGROUND OF THE INVENTION

1. Field of the Invention

The present invention generally relates to a fabrication method for a read only memory cell (ROM cell), and more particularly relates to a fabrication method for a post-process one-time programmable (OTP) read only memory cell (ROM cell).

2. Description of the Prior Art

In view of the programming process of the conventional read only memory product must be simultaneously performed in the manufacture process. When the manufacturer builds the product according to the order received from the customer, the actual amount of the product produced is usually larger than the order so as to avoid the short delivery of the product. However, it will cause excess product to storage in the depot after delivering and it will increase the manufacturing cost. Furthermore, the manufacturer could not immediately provide the goods of the programmed read only memory to customers because the read only memory product requires performing the programming process simultaneously in the manufacturing process.

Referring to FIG. 1A and FIG. 1B, a conventional ROM cell array is shown as a schematic representation of a structure and a cross-section view, in accordance with prior techniques. As shown in the figures, a substrate 10' is a P type semiconductor and the semiconductor substrate 10' is ions-implanted to form a plurality of N type semiconductor-implanted regions 12' (as a bit line of the ROM cell) respectively to divide into a drain region and a source region. Following an oxide layer 14' and a polysilicon layer 16' are sequentially formed on the semiconductor substrate 10'. The polysilicon layer 16' (as word line of the ROM cell) is used as the gate electrode of the ROM cell. The programming region of the ROM cell is positioned between those N type semiconductor-implanted regions 12', where signed regions 18' are defined. With such conventional read only memory one must simultaneously perform the programming process in the manufacture process.

Obviously, the main spirit of the present invention is to provide a method for fabricating a post-process OTP ROM cell, and then some disadvantages of well-known technology are overcome.

SUMMARY OF THE INVENTION

The primary object of the invention is to provide a method for fabricating a post-process one-time programmable (OTP) read only memory cell (ROM cell), wherein a sunken window-type isolating channel is formed by the oxide layer, which is positioned between the semiconductor-implanted regions and the polysilicon layer in the semiconductor substrate. After the manufacture process, the ROM cell can be programmed by applying a voltage thereon to penetrate the sunken window-type isolating channel.

Another object of the invention is to provide a method for fabricating a post-process OTP ROM cell, wherein a sunken window-type isolating channel is formed by the oxide layer, which is positioned between the semiconductor-implanted regions and the polysilicon layer in the semiconductor substrate. Due to the cross-section width of the window-type isolating channel is smaller than or equal to a cross-section width of the semiconductor-implanted regions and is positioned aligned within the cross-section width of those semiconductor-implanted regions, the structure of the present invention can effectively enhance the stability of the programming process.

A further object of the invention is to provide a method for fabricating a post-process OTP ROM cell. Without the require of simultaneously performing the programming process in the manufacture process, the manufacturers can instantaneously perform the programming process of the post-process OTP ROM cell of available goods after receiving the customer's order. This can enhance the maneuverability of the supply without the pressure from storing the large number of the stocks.

In order to achieve previous objects, the present invention provides a fabrication method for forming a post-process OTP ROM cell. The method comprises following essential steps. First, a semiconductor substrate is provided and the substrate is partially ion-implanted to form a plurality of semiconductor-implanted regions therein respectively to divide into a drain region and a source region. Then, a first oxide layer is formed on the semiconductor substrate and a portion of the first oxide layer is removed, where the portion is corresponding to those semiconductor-implanted regions. Following, a second oxide layer is conformably formed on the first oxide layer. Next, a polysilicon layer is formed on the second oxide layer and then the polysilicon layer is etched to be bar-positioned on the second oxide layer to use as the gate electrode of the ROM cell.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention discloses a method for fabricating a post-process one-time programmable (OTP) read only memory cell (ROM cell), wherein a sunken window-type isolating channel is formed by the oxide layer, which is positioned between the semiconductor-implanted regions and the polysilicon layer in the semiconductor substrate.

Figure 1A:
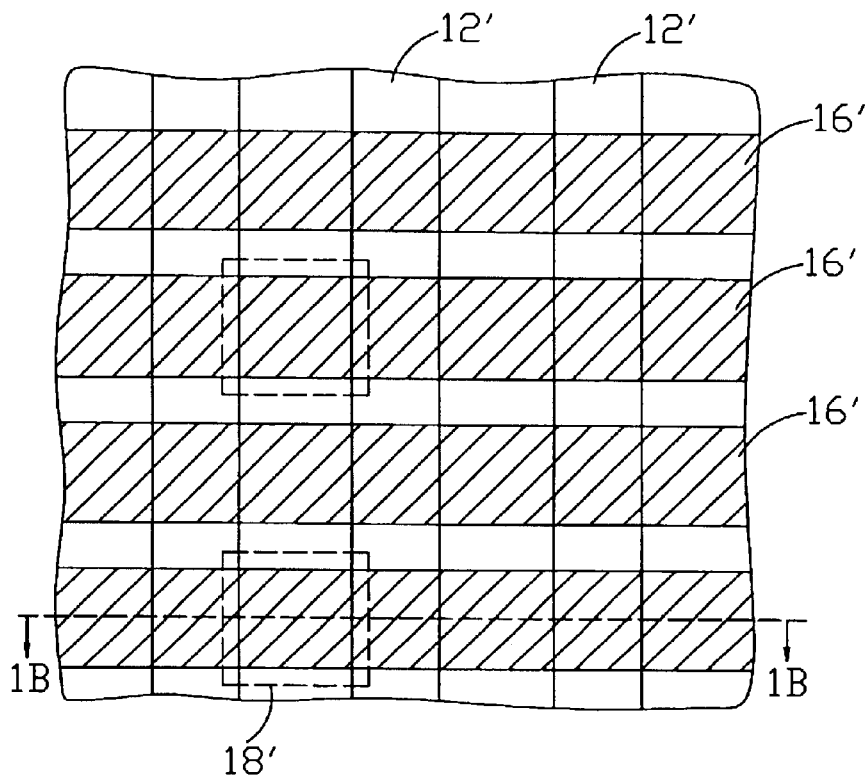
FIG. 1A is a schematic representation of the structure of a read only memory cell array, in accordance with prior techniques.
Figure 1B:
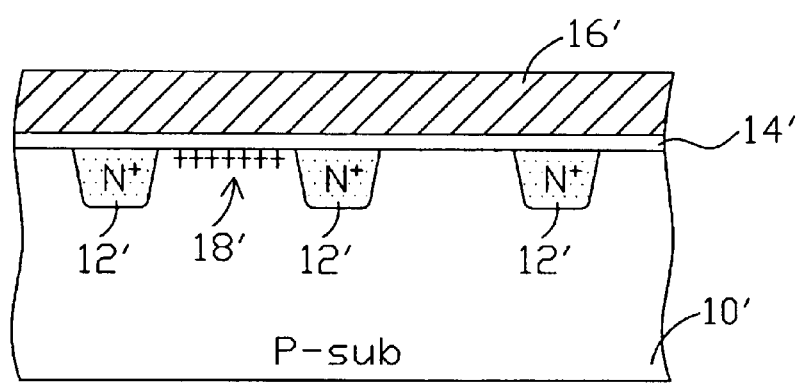
FIG. 1B is a schematic representation of the cross-section view of a read only memory cell array, in accordance with prior techniques.
Figure 2A:
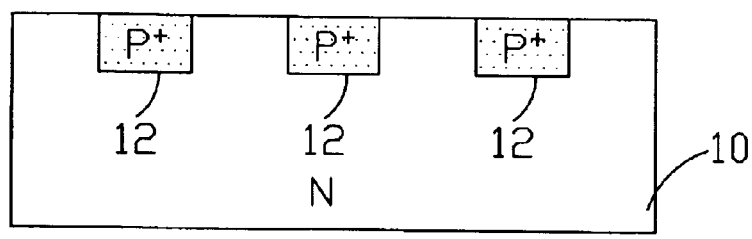
FIG. 2A to FIG. 2E are schematic representations structures at various stages during the formulation of a read only memory cell, in accordance with one preferred embodiment of the present invention.
Figure 2B:
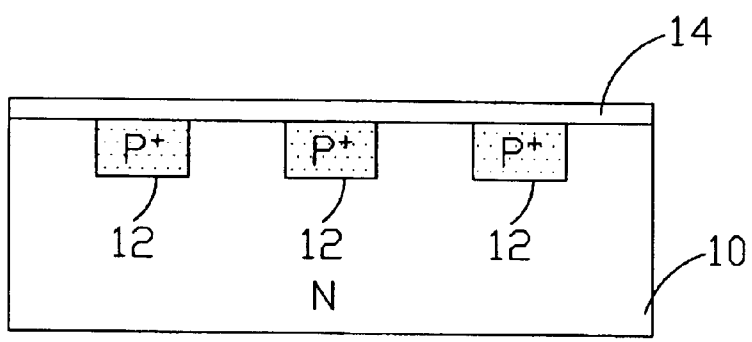
Figure 2C:
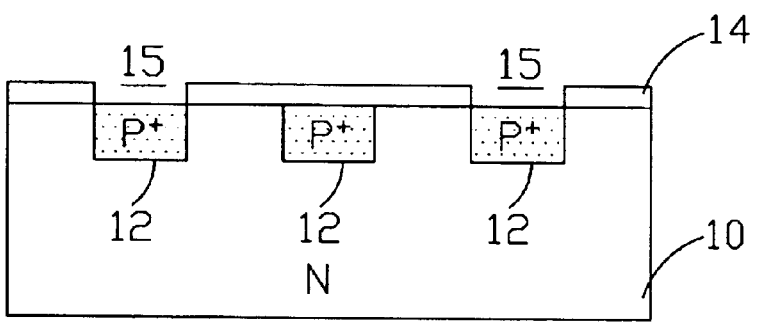
Figure 2D:
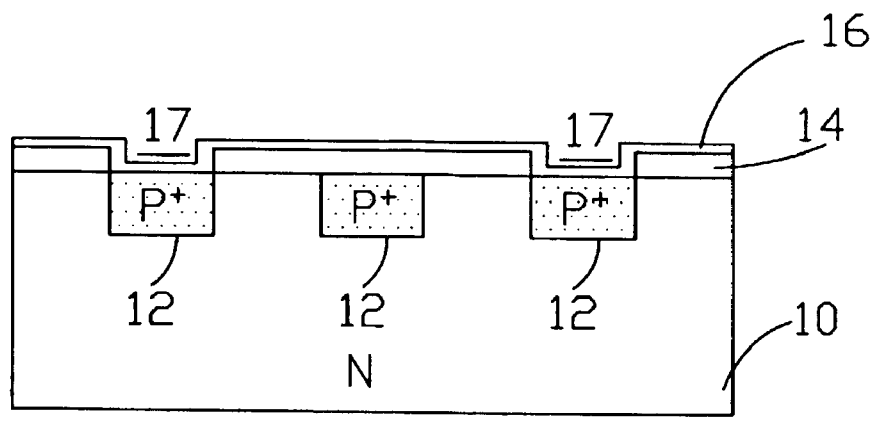
Figure 2E:
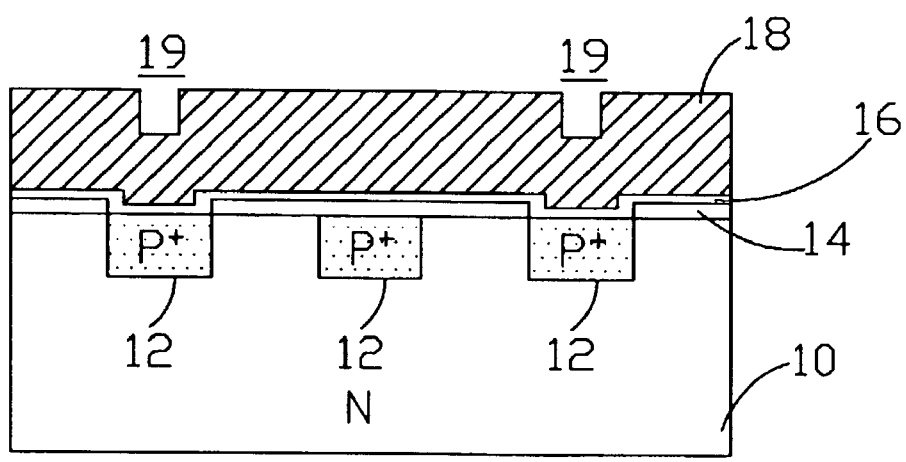

Referring to the FIG. 2A to the FIG. 2E, there are schematic representations structures at various stages to illustrate the formulation of a ROM cell of the present invention. The fabrication method of the present invention comprises following steps:

The step A is providing an N type semiconductor substrate 10 and utilizing ion implantation to from a plurality of P+ type semiconductor-implanted regions 12 into the substrate 10, wherein those semiconductor-implanted regions 12 are respectively to divide into a drain region and a source region, such as shown in the FIG. 2A.

The step B is conformably forming a first oxide layer 14 on the surface of the N type semiconductor substrate 10, such as shown in the FIG. 2B.

The step C is partially removing the first oxide layer 14, where is on those P+ type semiconductor-implanted regions 12 of the N type semiconductor substrate 10, such as those sunken regions 15 shown in the FIG. 2C.

The step D is conformably forming a second oxide layer 16 on the first oxide layer 14 to uniformly cover those sunken regions 15 of the first oxide layer 14 to naturally form a first window-type isolating channel 17, such as shown in the FIG. 2D.

The step E is conformably forming a polysilicon layer on the second oxide layer 16 and simultaneously naturally forming a second window-type isolating channel 19 at the first window-type isolating channel 17 of the second oxide layer 16, wherein the cross-section width of the second window-type isolating channel 19 is smaller than or equal to the cross-section width of the P+ type semiconductor-implanted regions 12, and wherein the second window-type isolating channel 19 is positioned aligned at the range of the cross-section width of the P+ type semiconductor-implanted regions 12, such as shown in the FIG. 2E.

Certainly, the mentioned embodiment of the present invention uses an N type semiconductor as a substrate and it should be recognized that it might be replaced with a P type semiconductor as a substrate or an N-well region of the P type semiconductor as a substrate. Moreover, those sunken regions 15 of the first oxide layer 14 can be formed by prior technology, such as the lithographic process. Furthermore, those sunken regions 15 of the first oxide layer 14 can be formed not only to completely expose the substrate 10 but also can be formed by partially removed without exposing the substrate. On the other way, due to the cross-section width of the second window-type isolating channel 19 is smaller than or equal to the cross-section width of the P+ type semiconductor-implanted regions 12 and positioned aligned within the cross-section width of the P+ type semiconductor-implanted regions 12, so in the post-process programming process, the voltage can precisely applied thereon to penetrate the second oxide layer 16 to effectively form a junction there between so as to enhance the stability of the programming process.

Figure 3A:
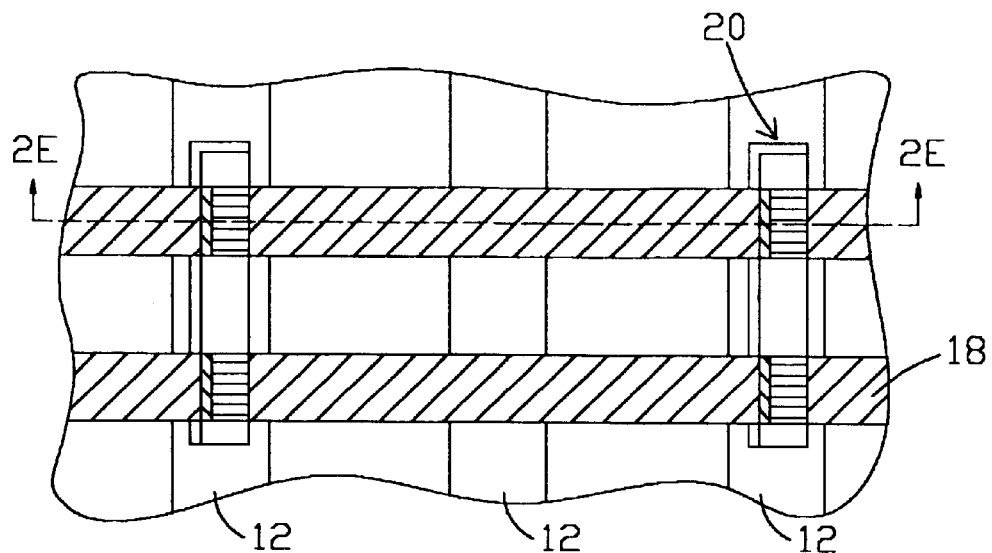
FIG. 3A is a schematic representation of the structure of a read only memory cell array, in accordance with one preferred embodiment of the present invention.
Figure 3B:
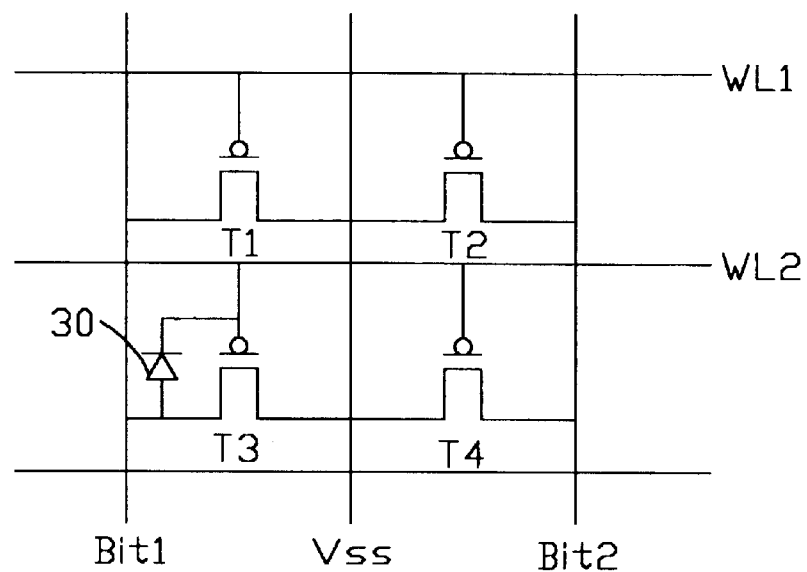
FIG. 3B is a schematic representation of the circuit of a read only memory cell array, in accordance with one preferred embodiment of the present invention.

Referring to the FIG. 3A and FIG. 3B, there are an array structure and its array circuit of the preferred embodiment of the present invention. As shown in figures, by using the lithographic technology, the polysilicon layer 18 is etched as bar-positioned or other spaced appropriately on the second oxide layer 16, which is used as the gate electrode of the ROM cell. The gate electrode is the word line of the array control wire and the P+ type semiconductor-implanted region 12 is the bit line of the array control wire. Moreover, an integrated window-type isolating channel 20 is formed by combining a portion of the first window-type isolating channel 17 and a portion of the second window-type isolating channel 19, as shown in the FIG. 3A.

In the programming process, such as of the T3 ROM cell, a voltage $V_{pp}$ is applied to the word line WL2 and a voltage $V_{cc}$ is applied to the word line WL1. When the bit line Bit1 is set at zero voltage and the bit line Bit2 is at $V_{cc}$ voltage, the T3 ROM cell is programmed accordingly by providing a P-N diode 30 in the T3 ROM cell, as shown in the FIG. 3B. In the reading process, it only needs a voltage $V_{cc}$ applied to the bit line Bit1 and the word line WL2 if it requires to turn on the T1 ROM cell. Furthermore, it only needs a voltage $V_{cc}$ applied to the bit line Bit1 and the word line WL1 and a zero voltage applied to the bit line Bit2 and the word line WL2 if it requires turning off the T3 ROM cell.

Owing to without the require of simultaneously performing the programming process in the manufacture process, the manufacturers can instantaneously perform the programming process of the post-process OTP ROM cell, which are available goods, after receiving the order from customers. The present invention can enhance the maneuverability of the supply but without the pressure from storing the large number of stocks.

Of course, it is to be understood that the invention described herein need not be limited to these disclosed embodiments. Various modification and similar changes are still possible within the spirit of this invention. In this way, all such variations and modifications are included within the intended scope of the invention and the scope of this invention should be defined by the appended claims.

What is claimed is:

1. A method for fabricating a post-process one-time programmable (OTP) read only memory cell (ROM cell), said fabrication method comprising following steps:

A. providing a semiconductor substrate implanted to form a plurality of semiconductor-implanted regions respectively to use as a drain region and a source region;

B. forming a first dielectric on a surface of said semiconductor substrate;

C. etching a plurality of portions of said first dielectric;

D. conformably forming a second dielectric on said first dielectric to define a first window-type isolating channel; and E. forming a polysilicon layer on a surface of said second dielectric to overlie a portion of said first window-type isolating channel of said second dielectric to define a second window-type isolating channel, said second window-type isolating channel being positioned aligned within a cross-section width of at least one said semiconductor-implanted region and being smaller in cross-section width than said semiconductor-implanted region.

2. The method according to claim 1, further comprising a step of etching said polysilicon to form a desired pattern.

3. The method according to claim 1, wherein the step C of etching said portions of said first dielectric is to form a sunken portion.

4. A method for fabricating a post-process one-time programmable (OTP) read only memory cell (ROM cell), said fabrication method comprising the steps of:

A. providing a semiconductor substrate implanted to form a plurality of semiconductor-implanted regions respectively to use as a drain region and a source region;

B. forming a first dielectric on a surface of said semiconductor substrate;

C. etching a plurality of portions of said first dielectric to form a sunken portion;

D. conformably forming a second dielectric on said first dielectric, said second dielectric overlying said sunken portion of said first dielectric to form a first window-type isolating channel; and E. forming a polysilicon layer on a surface of said second dielectric, said polysilicon layer overlying a portion of said first window-type isolating channel of said second dielectric to form a second window-type isolating channel;

wherein a cross-section width of said second window-type isolating channel is smaller than a cross-section width of said semiconductor-implanted regions and positioned aligned within the cross-section width of said semiconductor-implanted regions.

5. A method for fabricating a post-process one-time programmable (OTP) read only memory cell (ROM cell), said fabrication method comprising the steps of:

A. providing a semiconductor substrate implanted to form a plurality of semiconductor-implanted regions respectively to use as a drain region and a source region;

B. forming a first dielectric on a surface of said semiconductor substrate;

C. etching a plurality of portions of said first dielectric to form a sunken portion;

D. conformably forming a second dielectric on said first dielectric, said second dielectric overlying said sunken portion of said first dielectric to form a first window-type isolating channel; and E. forming a polysilicon layer on a surface of said second dielectric, said polysilicon layer overlying a portion of said first window-type isolating channel of said second dielectric to form a second window-type isolating channel;

wherein a cross-section width of said second window-type isolating channel is equal to a cross-section width of said semiconductor-implanted regions and positioned aligned within the cross-section width of said semiconductor-implanted regions.

6. The method according to claim 1, wherein said dielectric is made of an oxide layer.

* * * * *